United States Patent [19]
Hshieh et al.

[11] Patent Number: 5,578,851
[45] Date of Patent: Nov. 26, 1996

[54] TRENCHED DMOS TRANSISTOR HAVING THICK FIELD OXIDE IN TERMINATION REGION

[75] Inventors: Fwu-Iuan Hshieh, Saratoga; Mike F. Chang, Cupertino; Yueh-Se Ho, Sunnyvale; King Owyang, Atherton, all of Calif.

[73] Assignee: Siliconix incorporated, Santa Clara, Calif.

[21] Appl. No.: 625,639

[22] Filed: Mar. 29, 1996

Related U.S. Application Data

[63] Continuation of Ser. No. 290,323, Aug. 15, 1994, abandoned.

[51] Int. Cl.$^6$ .............................. H01L 29/76; H01L 29/94
[52] U.S. Cl. .................... 257/330; 257/331; 257/332; 257/333
[58] Field of Search ................... 257/329, 330, 257/331, 332, 333, 334

[56] References Cited

U.S. PATENT DOCUMENTS

| | | | |
|---|---|---|---|
| 3,892,169 | 7/1975 | Jarnot . | |
| 4,567,541 | 2/1986 | Baliga et al. | 257/331 |
| 4,941,026 | 7/1990 | Temple | 357/339 |
| 4,954,854 | 9/1990 | Dhong et al. | 257/332 |
| 5,019,526 | 5/1991 | Yamane et al. | 437/37 |
| 5,072,266 | 12/1991 | Bulucea et al. | 257/339 |
| 5,168,331 | 12/1992 | Yilmaz | 257/339 |
| 5,316,959 | 5/1994 | Kwan et al. | 437/40 |
| 5,341,011 | 8/1994 | Hshieh et al. | 257/330 |

FOREIGN PATENT DOCUMENTS

| | | | |
|---|---|---|---|
| 0345380 | 12/1989 | European Pat. Off. | 257/330 |
| 2647596 | 5/1990 | France . | |
| 3932621 | 9/1989 | Germany . | |
| 56-58267 | 5/1981 | Japan | 257/335 |
| 59-84474 | 5/1984 | Japan | 257/329 |
| 62-176168 | 8/1987 | Japan | 257/342 |
| 1-42177 | 2/1989 | Japan | 257/339 |
| 1-198076 | 8/1989 | Japan . | |
| 1-310576 | 12/1989 | Japan . | |
| 2-91976 | 3/1990 | Japan . | |
| 8504161 | 8/1988 | Sweden . | |
| WO82/02917 | 9/1982 | WIPO . | |

OTHER PUBLICATIONS

Barbuscia, et al., *IEDM*, 1984, pp. 757–760 "Modeling of Polysilicon Dopant Diffusion for Shallow–Junction Bipolar Technology".

S. C. Sun et al., pp. 356–367, *IEEE Trans, Electron Devices*, vol. ED–27, Feb. 1980 "Modeling of the On–Resistance of LDMOS, VDMOS, and VMOS power Transistors".

Chang et al., et al. "Vertical FET Random–Access Memories with Deep Trench Isolation", *IBM Technical Disc. Bulletin*, Vo. 22, No. 8B, Jan. 1980, pp. 3683–3687.

P. Ou–Yang, "Double Ion Implanted V–MOS Technology", *IEEE Journal of Solid State Circuits*, vol. SC–12, No. 1, Feb. 1977, pp. 3–8.

K. Shenai, et al., International Electron Devices Meeting, 9 Dec. 1990, San Francisco, USA, pp. 793–797.

*Primary Examiner*—Ngân V. Ngô
*Attorney, Agent, or Firm*—Skjerven, Morrill, MacPherson, Franklin & Friel; Norman R. Klivans

[57] ABSTRACT

A trenched DMOS transistor is fabricated using seven masking steps. One masking step defines both the P+ deep body regions and the active portions of the transistor which are masked using a LOCOS process. A second masking step defines the insulating oxide in the termination region. The insulating (oxide) layer in the termination region is thus thicker than in the active region of the transistor, thereby improving process control and reducing substrate contamination during processing. Additionally, the thicker field oxide in the termination region improves electric field distribution so that avalanche breakdown occurs in the cell (active) region rather than in the termination region, and thus breakdown voltage behavior is more stable and predictable.

5 Claims, 3 Drawing Sheets

TRENCHED DMOS TRANSISTOR HAVING THICK FIELD OXIDE IN TERMINATION REGION

This application is a division of application Ser. No. 08/290,323, filed Aug. 15, 1994, now abandoned

CROSS-REFERENCE TO RELATED PATENT

This application is related to commonly owned U.S. Pat. No. 5,316,959, entitled "Trenched DMOS Transistor Fabrication Using Six Masks", inventors Sze-Hon Kwan et al. issued May 31, 1994.

BACKGROUND OF THE INVENTION

1. Field of the Invention

This invention relates to a method for fabricating a trenched DMOS transistor using e.g. seven masking steps, resulting in a transistor having narrow trenches, shallow diffusions, and formed using relatively few process steps, and having a thick dielectric layer in the termination region.

1. Description Of The Prior Art

DMOS transistors are well known as a type of MOSFET (metal on semiconductor field effect transistor) using diffusions to form the transistor regions, with a typical application being as a power transistor. Such devices enjoy widespread use in such applications as automobile electrical systems, power supplies, and power management applications.

Many different processes have been used for the fabrication of power MOSFET devices over the years; these are generally deep diffusion processes. It is also well known to form such transistors having a trench in the substrate, the trench being lined with a thin oxide layer and filled with a conductive polysilicon to form the transistor gate structure.

Prior art trenched DMOS transistors have the shortcoming that typically it takes a fairly large number (such as eight or nine) fabrication masking steps to define the various transistor regions, including the tubs in which the active transistor regions are formed, the body region of the transistor, the source region of the transistor, the body contact regions, each of which are separate diffusions, and the termination structures, i.e. field plates and field rings. Additional masking steps define the oxide layers and polysilicon portions of the transistor. Each additional masking step requires a mask alignment and thus results in the possibility of alignment error, undesirably reducing yield. Additionally, the many process steps which include temperature cycles tend to result in unwanted diffusion of certain of the implanted ions, thus undesirably altering the lateral extent and/or depth of various of the diffused regions.

Thus there is a need for transistor fabrication processes using relatively few masks.

The process and resulting transistor structure of the above-referenced patent provide the same oxide (dielectric) layer thickness in the active (gate) region of the transistor as in the termination (edge) portion of the transistor. This has been found to be somewhat disadvantageous because breakdown instability is observed probably due to the charging effect from the passivation layer and floating gate.

SUMMARY OF THE INVENTION

In accordance with the invention, a trenched DMOS transistor has relatively narrow and shallow trenches in one embodiment with relatively shallow associated transistor active regions. By using an additional masking step to expose the principle surface of the substrate in the termination region of the transistor prior to growing the thick field oxide, a field oxide dielectric layer is provided in the termination region which is relatively thicker than the gate oxide in the active portions of the transistor. Advantageously the thicker field oxide in the termination region improves electric field distribution so that avalanche breakdown occurs in the cell (active) region rather than in the termination region, and thus breakdown voltage behavior is more stable and predictable. Furthermore, process control is improved due to this thicker oxide. Additionally, thicker oxide in the termination region prevents dopant or ionic contamination of the underlying substrate from the overlying layers, thereby reducing leakage current problems in the termination region.

In one embodiment, in addition to the thick field oxide in the termination region, also present in the termination region is a field plate which is electrically connected to a guard ring by a metallized contact and shorted to the source region in the transistor active region.

DETAILED DESCRIPTION OF THE INVENTION

The present invention is to be understood in the context of two commonly owned other disclosures, both incorporated herein by reference. The first of these is U.S. Pat. No. 5,304,831, entitled "Low On-Resistance Power MOS Technology", inventors Hamza Yilmaz et al., which discloses a method for fabricating a DMOS transistor using five masking steps. The second is U.S. patent application Ser. No. 07/918,996, filed Jul. 23, 1993 entitled "Field Effect Transistor Having Edge Termination Utilizing Trench Technology", inventor Izak Bencuya, now U.S. Pat. No. 5,430,324, issued Jul. 4, 1995.

A process in accordance with the invention and using seven masking steps is described hereinafter. It is to be understood that the reference herein to "seven masking masking steps" is illustrative and not limiting; other processes with other numbers of masking steps are also in accordance with the present invention.

Figure 1A:
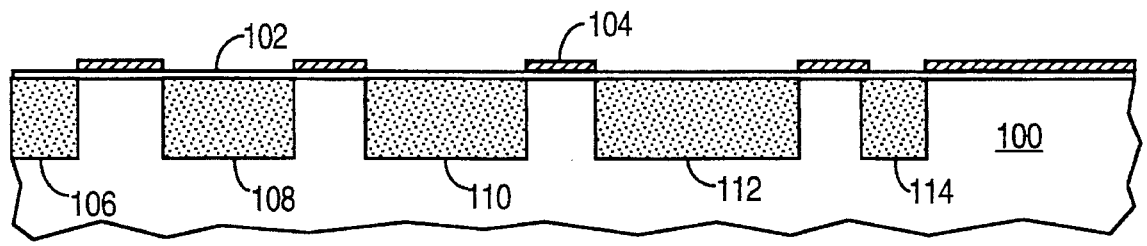
FIGS. 1a through 1k show in cross section a sequence of steps to form a transistor in accordance With the present invention.

In FIG. 1a an N-channel process in accordance with the invention uses an N-doped epitaxial layer 100 having a resistivity of for example 0.20 to 2.0 ohm-cm formed on a conventional N+ doped silicon substrate (not shown), the layer 100 having a resistivity of for example 0.001 to 0.010 ohm-cm and being 5 to 15 microns (micrometers) thick. The substrate is about 500 µm thick. A thin layer of silicon dioxide 102 is thermally grown 300 Å to 500 Å thick on the principal surface of the epitaxial layer 100, and a mask layer of silicon nitride 104 having a thickness of from 100 Å to 2000 Å is deposited thereon. Mask layer 104 is conventionally patterned and etched. Then boron is predeposited by using the boron nitride process or by implanting boron at an energy of 30 to 60 KeV and a dose of $2\times10^{13}$ to $1\times10^{16}/cm^2$ through the mask layer 104 and driven in to form P+ deep body regions 106, 108 which are about 2 to 3 microns deep and having a final concentration at the principal surface of $1\times10^{16}$ to $2\times10^{19}/cm^3$, and similar P+ field rings (termination structures) 110, 112, 114.

Figure 1B:
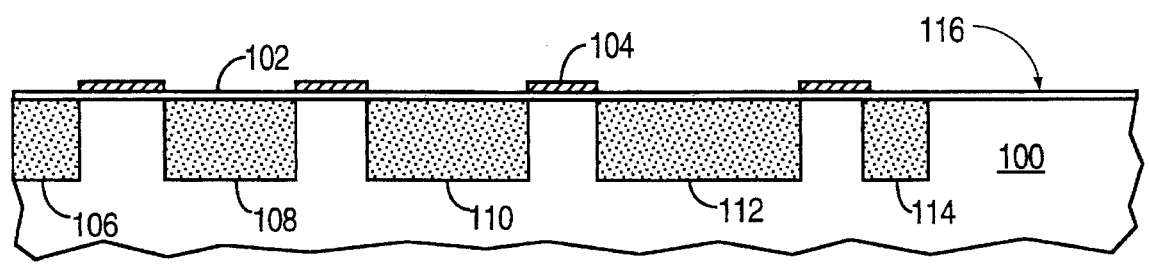

Then in FIG. 1b, an additional mask is used to pattern mask layer 104 in the termination region 116, exposing the relatively thin gate oxide layer 102. This additional masking step is an improvement herein over the method disclosed in the above referenced U.S. Pat. No. 5,316,959.

Figure 1C:
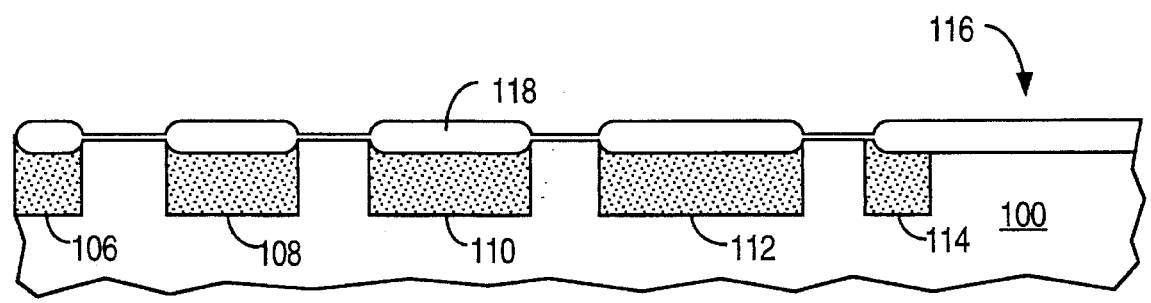

Then local oxidation (LOCOS) 118 of silicon to a thickness of 5,000 to 8,000 Å in FIG. 1c to grow the thicker field oxide layer is followed by stripping of the nitride mask layer 104 to define both the active transistor cells and the device termination portion. (It is to be understood that in FIGS. 1a to 1k, the device termination region is located at the right hand side of the figures and the central active cell portion of the transistor is at the left hand portion of the figures. Also, the process steps are shown schematically and not to scale.)

As shown in Figure 1c, thick field oxide layer 118 extends over termination region 116.

Figure 1D:
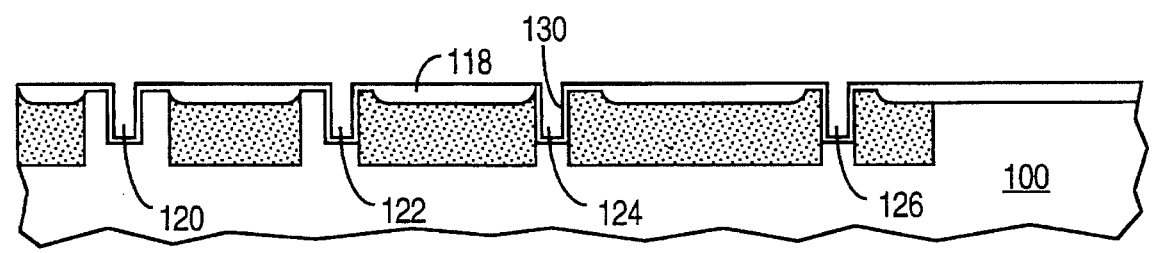

Then in FIG. 1d an LTO (low temperature oxide) second mask layer (not shown) is conventionally deposited and patterned, and trenches 120, 122, 124, 126 are each formed by anisotropic reactive ion dry etching to a depth of 1.5 to 3 microns and a width of 1 to 2 microns. Trenches 120, 122, 124 serve as the gate electrode trenches and trenches 124, 126 separate the field rings from adjacent structures. After the trench walls and corners are smoothed by an isotropic plasma "round hole" etch and a sacrificial oxide growth and subsequent stripping of the sacrificial oxide, the gate oxide layer 130 is conventionally grown on the sidewalls of the trenches 120, 122, . . . , 126 to a thickness of 100 to 1000 Å.

Figure 1E:
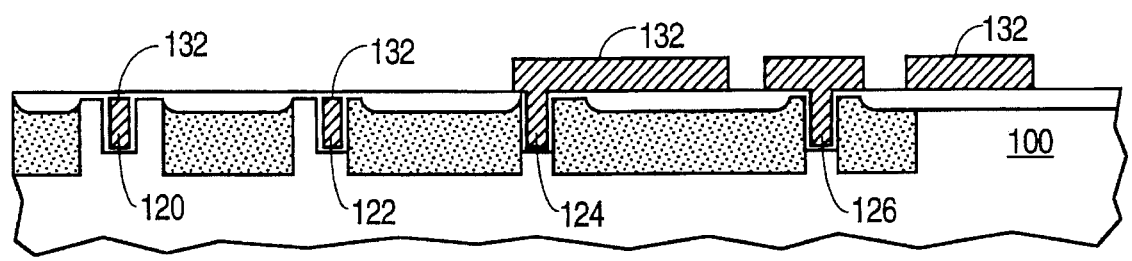

Then in FIG. 1e the trenches are planarized by the deposition of a layer of polycrystalline silicon 132 which is at least as thick as the width of each trench. This relatively thick polysilicon layer 132 is partially dry etched away (without a mask) leaving a thickness of 0.5 microns. By protecting the principal surface with photo resist (not shown), the substrate back side polysilicon and oxide layers are removed by wet chemical etch. The remaining polysilicon 132 is then doped to a conductivity less than 2 ohm/square. Then masking of polysilicon 132 and a second polysilicon "defreckable" etching is performed, resulting in the structure of FIG. 1e defining windows for subsequent processing. The use of the LOCOS oxide process eliminates the prior art "poly stringer" problem by reducing the oxide step height.

Figure 1F:
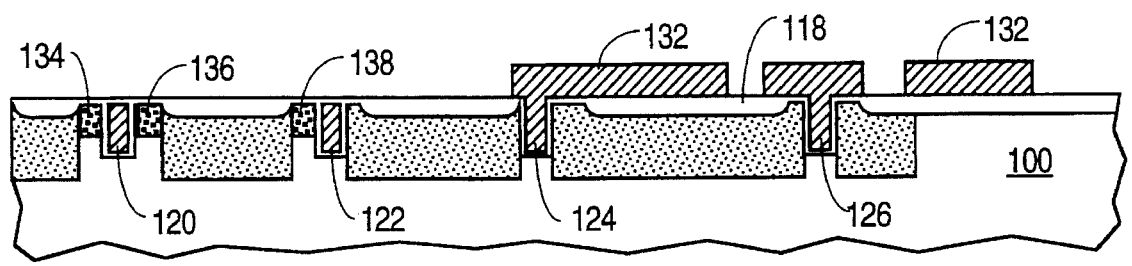

This is followed in FIG. 1f by a blanket boron P-body implant and diffusion at an energy of about 60 KeV and dose of $2 \times 10^{13}$ to $5 \times 10^{13}/cm^2$ providing a final surface concentration of about $2 \times 10^{17}/cm^3$ forming body regions 134, 136, 138.

Figure 1G:
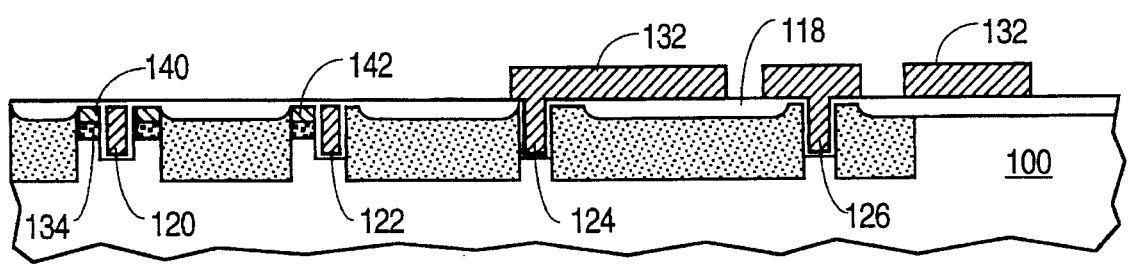

Then a blanket N+ arsenic source implant and diffusion are performed at an energy of 60 to 120 KeV at a dosage of $1 \times 10^{15}$ to $1 \times 10^{16}/cm^2$ to achieve a final surface concentration of $5 \times 10^{19}/cm^3$ in FIG. 1g forming N+ source regions 140, 142. The N+ source regions 140, 142 depth is about 0.5 microns.

Figure 1H:
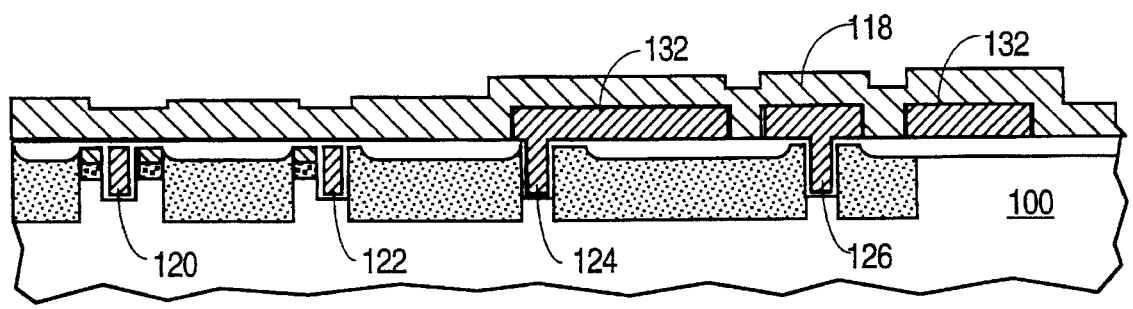

Then in FIG. 1h a layer of boro-phosphorsilicate glass (BPSG) 146 is conventionally deposited to a thickness of about 1.35 microns over the entire structure. Then in FIG. 1i BPSG layer 146 is masked and patterned to define the electrical contact openings 150, 152, 154, 156 to the transistor structure. Also, opening 158 in the termination region BPSG layer 146 is formed in this step. The BPSG layer 140 is then conventionally reflowed to smooth its corners.

Figure 1I:
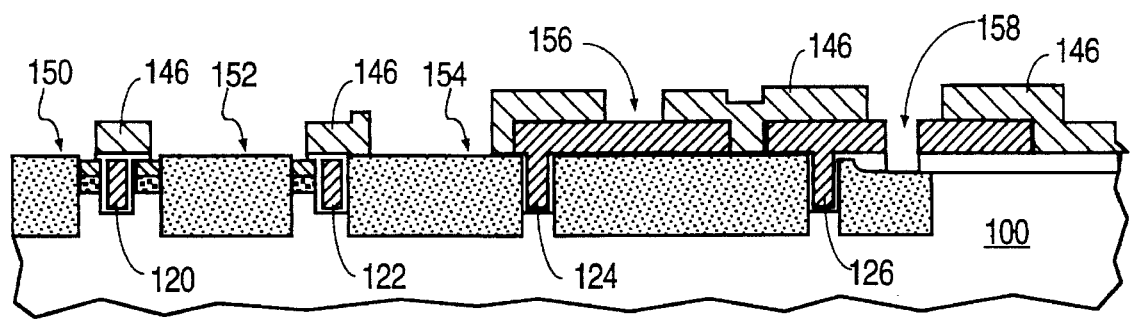
Figure 1J:
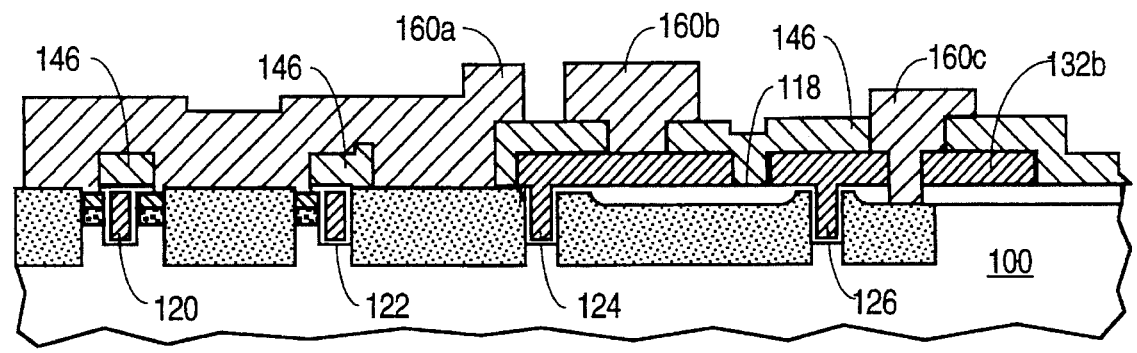

Then in FIG. 1j a layer of metal 160 (e.g. aluminum or aluminum plus 1% silicon) is deposited over the entire structure, such as by sputtering and then etched using a conventional patterned mask layer.

Figure 1K:
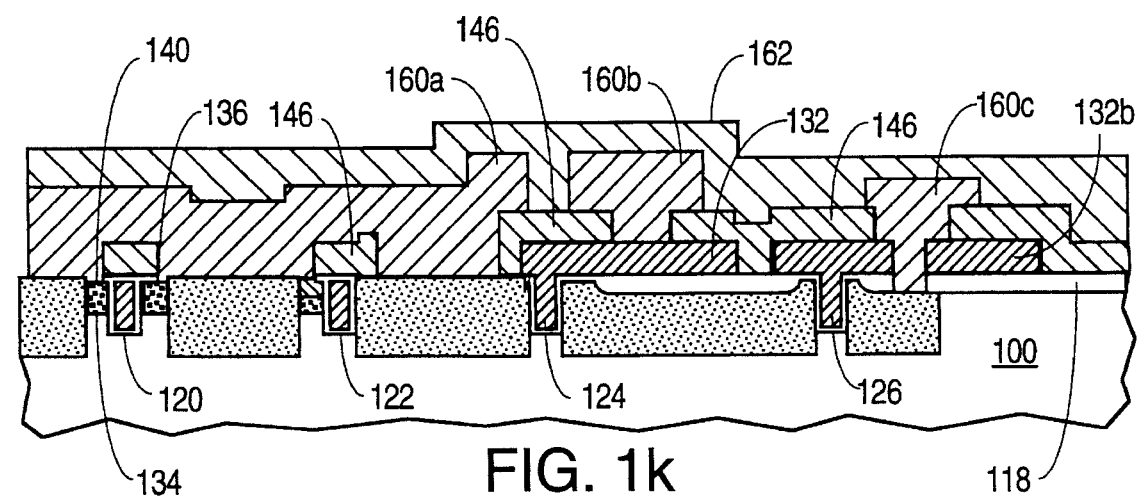

Then in FIG. 1k a passivation layer 162 such as PSG or plasma nitride is conventionally deposited and by a mask step, bonding pad openings (not shown) to contact the gate and source area are opened therethrough.

In contrast to the final structure disclosed in the above-referenced U.S. Pat. No. 5,316,959, here the thick field oxide layer 118 extends to the edge of the termination region on the right side of FIG. 1k, providing the above-described benefits. Also, here the P+ doped region 114 is contacted by overlying metal contact 160c. The resulting termination structure is a P+ guard ring 114 electrically connected to polysilicon plate 132b via contact 160c and to the transistor source regions.

The polysilicon field plate 132b improves breakdown voltage in the termination region by smoothing the electric field distribution near the P+/N junction in the termination region.

As will be recognized, seven masking steps are thereby utilized in one embodiment of the fabrication process described in FIGS. 1a to 1j of the present invention. These seven masking steps are as follows:

1) a deep body P+ masking step in which openings are formed in layer 102 as shown in FIG. 1a through which P+ regions are doped;

2) a termination region mask patterning step in which an additional opening is formed in mask layer 104 for growing LOCOS oxide layer 118 over the termination region 116 shown in FIG. 1b;

3) a trench masking step in which a layer of photoresist is patterned to define the trenches 120, . . . , 126 shown in FIG. 1d;

4) a polysilicon masking step in which a layer of photoresist is used to protect and thereby to define the portions of polysilicon layer 132 shown in FIG. 1e;

5) a contact opening masking step in which portions of a BPSG layer 146 are removed to define a contact to the P+ regions and to define a contact to the doped polysilicon in trench 124 of FIG. 1i.

6) a metal masking step in which portions of a metal layer 160 are removed to define the metal source electrode 160(a), the metal gate finger 160(b), and the guard ring contact 160c of FIG. 1j; and 7) a conventional pad masking step in which portions of passivation layer 162 are removed to expose a gate bonding pad and source bonding pad.

It is to be understood that the above-described process is for fabricating an N-channel vertical DMOS transistor device as shown. By reversal of the various semiconductor region doping types the opposite type, a P-channel vertical DMOS transistor structure may also be formed.

With reference to the structure of FIG. 1k, the field rings 112, 114 are separated by insulated trench 126, thus allowing the field rings to be closely spaced together and hence conserving chip surface area. Trench 126 is filled with doped polysilicon. Trench 124 is also filled with polysilicon and is electrically connected to the gate finger electrode connected in turn (outside the plane of FIG. 1j) to the doped polysilicon which fills trenches 120, 122. The drain electrode is conventionally formed on the back side (not shown) of the substrate.

The area immediately to the right of trench 122 has no active (source or body) regions and hence serves as a dummy cell adjacent to the termination structures; this dummy cell can be dispensed with in one embodiment. Also, the above described process can be implemented in a transistor having a termination other than that described herein.

The above description is illustrative and not limiting; further modifications will be apparent to one skilled in the art in light of this specification and are intended to fall within the scope of the appended claims.

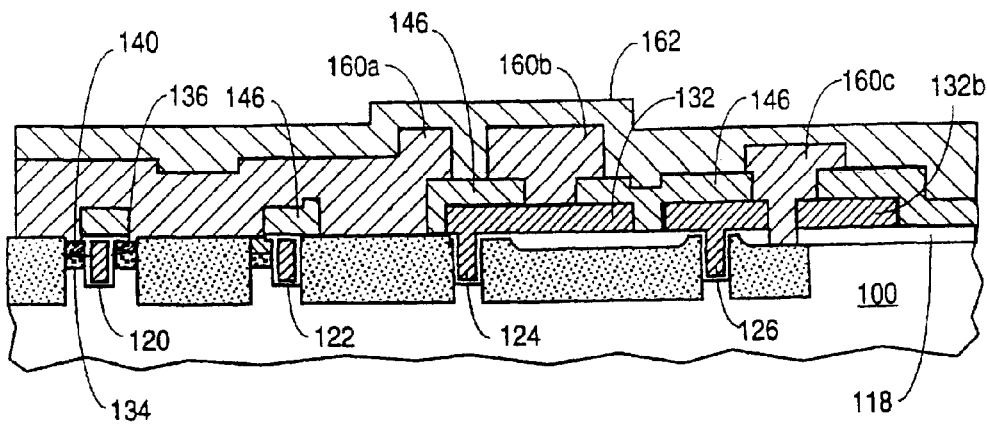

We claim:

1. A field effect transistor comprising:
   a semiconductor substrate having a first conductivity type and having a principal surface;
   an active region of the transistor comprising:
   (a) a plurality of spaced-apart doped semiconductor regions of a second conductivity type extending from the principal surface into the substrate, being deep body regions of the transistor;
   (b) a plurality of trenches extending into the substrate from the principal surface and being filled with a conductive material; and
   (c) doped regions of the first and second conductivity type extending into the substrate from the principal surface adjacent at least some of the trenches, being respectively source and body regions of the transistor; and
   a termination region of the transistor comprising:
   a field oxide layer formed on portions of the principal surface, including on a portion of the principal surface extending to an outer edge of the termination region and beyond an outer edge of an underlying doped region.

2. The transistor of claim 1, further comprising a conductive layer overlying the field oxide layer in the termination region and being in electrical contact with at least one doped semiconductor region of the second conductivity type which extends into the substrate in the termination region.

3. The transistor of claim 1, wherein the field oxide layer is at least 5000 Å thick.

4. The transistor of claim 2, wherein the conductive layer is a field plate, and wherein the at least one doped semiconductor region in the termination region is a guard ring, and further comprising a guard ring conductive contact overlying and in contact with the guard ring and also contacting the field plate.

5. The transistor of claim 4, wherein the field oxide layer extends from the outer edge of the termination region laterally inward to the guard ring contact.

* * * * *

UNITED STATES PATENT AND TRADEMARK OFFICE
CERTIFICATE OF CORRECTION

PATENT NO. : 5,578,851
DATED : November 26, 1996
INVENTOR(S) : Fwu-Iuan Hshieh et al.

It is certified that error appears in the above-identified patent and that said Letters Patent is hereby corrected as shown below:

At column 2, line 26, delete "With" and substitute --with--.

Signed and Sealed this

Twenty-fourth Day of November, 1998

Attest:

BRUCE LEHMAN

*Attesting Officer*  *Commissioner of Patents and Trademarks*

UNITED STATES PATENT AND TRADEMARK OFFICE
CERTIFICATE OF CORRECTION

PATENT NO. : 5,578,851
DATED : November 26, 1996
INVENTOR(S) : Hshieh et al.

It is certified that error appears in the above-identified patent and that said Letters Patent is hereby corrected as shown below:

<u>Title page,</u>
Title page showing an illustrative figure, should be deleted and replaced with the attached title page.

Signed and Sealed this

Eleventh Day of June, 2002

Attest:

JAMES E. ROGAN
Attesting Officer        Director of the United States Patent and Trademark Office

United States Patent [19]
Hshieh et al.

[11] Patent Number: 5,578,851
[45] Date of Patent: Nov. 26, 1996

[54] TRENCHED DMOS TRANSISTOR HAVING THICK FIELD OXIDE IN TERMINATION REGION

[75] Inventors: Fwu-luan Hshieh, Saratoga; Mike F. Chang, Cupertino; Yueh-Se Ho, Sunnyvale; King Owyang, Atherton, all of Calif.

[73] Assignee: Siliconix incorporated, Santa Clara, Calif.

[21] Appl. No.: 625,639

[22] Filed: Mar. 29, 1996

Related U.S. Application Data

[63] Continuation of Ser. No. 290,323, Aug. 15, 1994, abandoned.

[51] Int. Cl.$^6$ .......................... H01L 29/76; H01L 29/94
[52] U.S. Cl. .......................... 257/330; 257/331; 257/332; 257/333
[58] Field of Search .......................... 257/329, 330, 257/331, 332, 333, 334

[56] References Cited

U.S. PATENT DOCUMENTS

| | | | |
|---|---|---|---|
| 3,892,169 | 7/1975 | Jarnot . | |
| 4,567,541 | 2/1986 | Baliga et al. | 257/331 |
| 4,941,026 | 7/1990 | Temple | 357/339 |
| 4,954,854 | 9/1990 | Dhong et al. | 257/332 |
| 5,019,526 | 5/1991 | Yamane et al. | 437/37 |
| 5,072,266 | 12/1991 | Bulucea et al. | 257/339 |
| 5,168,331 | 12/1992 | Yilmaz | 257/339 |
| 5,316,959 | 5/1994 | Kwan et al. | 437/40 |
| 5,341,011 | 8/1994 | Hshieh et al. | 257/330 |

FOREIGN PATENT DOCUMENTS

| | | | |
|---|---|---|---|
| 0345380 | 12/1989 | European Pat. Off. | 257/330 |
| 2647596 | 5/1990 | France . | |
| 3932621 | 9/1989 | Germany . | |
| 56-58267 | 5/1981 | Japan | 257/335 |
| 59-84474 | 5/1984 | Japan | 257/329 |
| 62-176168 | 8/1987 | Japan | 257/342 |
| 1-42177 | 2/1989 | Japan | 257/339 |
| 1-198076 | 8/1989 | Japan . | |
| 1-310576 | 12/1989 | Japan . | |
| 2-91976 | 3/1990 | Japan . | |
| 8504161 | 8/1988 | Sweden . | |
| WO82/02917 | 9/1982 | WIPO . | |

OTHER PUBLICATIONS

Barbuscia, et al., *IEDM*, 1984, pp. 757–760 "Modeling of Polysilicon Dopant Diffusion for Shallow–Junction Bipolar Technology".
S. C. Sun et al., pp. 356–367, *IEEE Trans, Electron Devices*, vol. ED–27, Feb. 1980 "Modeling of the On–Resistance of LDMOS, VDMOS, and VMOS power Transistors".
Chang et al., et al. "Vertical FET Random–Access Memories with Deep Trench Isolation", *IBM Technical Disc. Bulletin*, Vo. 22, No. 8B, Jan. 1980, pp. 3683–3687.
P. Ou-Yang, "Double Ion Implanted V–MOS Technology", *IEEE Journal of Solid State Circuits*, vol. SC–12, No. 1, Feb. 1977, pp. 3–8.
K. Shenai, et al., International Electron Devices Meeting, 9 Dec. 1990, San Francisco, USA, pp. 793–797.

*Primary Examiner*—Ngân V. Ngô
*Attorney, Agent, or Firm*—Skjerven, Morrill, MacPherson, Franklin & Friel; Norman R. Klivans

[57] ABSTRACT

A trenched DMOS transistor is fabricated using seven masking steps. One masking step defines both the P+ deep body regions and the active portions of the transistor which are masked using a LOCOS process. A second masking step defines the insulating oxide in the termination region. The insulating (oxide) layer in the termination region is thus thicker than in the active region of the transistor, thereby improving process control and reducing substrate contamination during processing. Additionally, the thicker field oxide in the termination region improves electric field distribution so that avalanche breakdown occurs in the cell (active) region rather than in the termination region, and thus breakdown voltage behavior is more stable and predictable.

5 Claims, 3 Drawing Sheets